United States Patent
Balakrishnan et al.

(10) Patent No.: US 9,685,510 B2
(45) Date of Patent: Jun. 20, 2017

(54) SIGE CMOS WITH TENSELY STRAINED NFET AND COMPRESSIVELY STRAINED PFET

(71) Applicant: International Business Machines Corporation, Armonk, NY (US)

(72) Inventors: Karthik Balakrishnan, White Plains, NY (US); Kangguo Cheng, Schenectady, NY (US); Pouya Hashemi, White Plains, NY (US); Alexander Reznicek, Troy, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 14/849,683

(22) Filed: Sep. 10, 2015

(65) Prior Publication Data

US 2017/0077231 A1    Mar. 16, 2017

(51) Int. Cl.
*H01L 27/12*  (2006.01)
*H01L 29/10*  (2006.01)
(Continued)

(52) U.S. Cl.
CPC .. *H01L 29/1054* (2013.01); *H01L 21/823821* (2013.01); *H01L 27/1203* (2013.01);
(Continued)

(58) Field of Classification Search
CPC ......... H01L 29/1054; H01L 21/823821; H01L 27/1208; H01L 27/1211; H01L 29/7848; H01L 29/785
(Continued)

(56) References Cited

U.S. PATENT DOCUMENTS 7,037,770 B2    5/2006    Chidambarrao et al.
7,193,322 B2    3/2007    Lee et al.
(Continued)

*Primary Examiner* — Benjamin Sandvik
*Assistant Examiner* — Herve Assouman
(74) *Attorney, Agent, or Firm* — Harrington & Smith; Louis J. Percello

(57) ABSTRACT

A method includes providing a Si substrate having an overlying layer of $Si_{1-x}Ge_x$; growing, over the layer of $Si_{1-x}Ge_x$, a layer of Si in an NFET region and a second layer of $Si_{1-x}Ge_x$ in a PFET region; partitioning the layer of $Si_{1-x}Ge_x$ into a structure including a first $Si_{1-x}Ge_x$ sub-layer disposed in the NFET region and a second $Si_{1-x}Ge_x$ sub-layer disposed in the PFET region; annealing the structure to convert the first $Si_{1-x}Ge_x$ sub-layer and the overlying Si layer into a tensily strained $Si_{1-x}Ge_x$ intermixed layer and to convert the second $Si_{1-x}Ge_x$ sub-layer and the overlying second layer of $Si_{1-x}Ge_x$ into a compressively strained $Si_{1-x}Ge_x$ intermixed layer, where a value of x in the tensily strained $Si_{1-x}Ge_x$ intermixed layer is less than a value of x in the compressively strained $Si_{1-x}Ge_x$ intermixed layer and forming a first transistor in the NFET region and a second transistor in the PFET region.

20 Claims, 3 Drawing Sheets

(51) Int. Cl.
*H01L 29/78* (2006.01)
*H01L 21/8238* (2006.01)

(52) U.S. Cl.
CPC ........ *H01L 27/1211* (2013.01); *H01L 29/785* (2013.01); *H01L 29/7848* (2013.01)

(58) Field of Classification Search
USPC .......................................................... 257/351
See application file for complete search history.

(56) References Cited

U.S. PATENT DOCUMENTS

| | | | |
|---|---|---|---|
| 7,972,916 B1* | 7/2011 | Connelly | ................ H01L 29/78 257/E21.542 |
| 8,232,186 B2 | 7/2012 | Harley et al. | |
| 8,643,061 B2 | 2/2014 | Yin et al. | |
| 8,901,566 B2 | 12/2014 | Chen et al. | |
| 8,916,933 B2 | 12/2014 | Cheng et al. | |
| 8,969,878 B2 | 3/2015 | Kim | |
| 8,987,069 B1 | 3/2015 | Adam et al. | |
| 2004/0178406 A1* | 9/2004 | Chu | .................. H01L 21/02381 257/19 |
| 2008/0191281 A1* | 8/2008 | Chidambarrao | ........ H01L 21/84 257/351 |
| 2012/0068267 A1 | 3/2012 | Bedell et al. | |
| 2012/0098067 A1* | 4/2012 | Yin | .................. H01L 21/76254 257/351 |
| 2012/0216158 A1 | 8/2012 | Bedell et al. | |
| 2012/0228716 A1 | 9/2012 | Harley et al. | |
| 2015/0102385 A1 | 4/2015 | Fung | |
| 2015/0155301 A1 | 6/2015 | Adam et al. | |

* cited by examiner

SIGE CMOS WITH TENSELY STRAINED NFET AND COMPRESSIVELY STRAINED PFET

TECHNICAL FIELD

The various embodiments of this invention relate generally to semiconductor devices and fabrication techniques and, more specifically, relate to the fabrication of complementary metal oxide semiconductor (CMOS) transistor devices comprised of SiGe.

BACKGROUND

Tensile strained silicon (s-Si) enhances electron mobility by lifting the conduction band degeneracies, reducing carrier scattering and increasing the population of carriers in sub-bands with lower transverse effective mass. Channel engineering using Si or s-Si for an NFET and compressive strained SiGe for a PFET is one option for realizing small geometry devices while meeting performance targets. However, the fabrication of transistors having a tensile strained silicon germanium (SiGe) channel, for n-type field effect transistors (NFETs), and a compressive strained SiGe channel, for p-type field effect transistors (PFETs), on the same common substrate would provide advantages and would be a desirable goal.

SUMMARY

In a first aspect thereof the embodiments of this invention provide a method that comprises providing a Si substrate having an overlying layer of $Si_{1-x}Ge_x$; growing, over the layer of $Si_{1-x}Ge_x$, a layer of Si in what will be an NFET region and a second layer of $Si_{1-x}Ge_x$ in what will be a PFET region; partitioning the layer of $Si_{1-x}Ge_x$ into a structure comprised of a first $Si_{1-x}Ge_x$ sub-layer disposed in the NFET region and into a second $Si_{1-x}Ge_x$ sub-layer disposed in the PFET region; annealing the structure to convert the first $Si_{1-x}Ge_x$ sub-layer and the overlying Si layer into a tensily strained $Si_{1-x}Ge_x$ intermixed layer and to convert the second $Si_{1-x}Ge_x$ sub-layer and the overlying second layer of $Si_{1-x}Ge_x$ into a compressively strained $Si_{1-x}Ge_x$ intermixed layer, where a value of x in the tensily strained $Si_{1-x}Ge_x$ intermixed layer is less than a value of x in the compressively strained $Si_{1-x}Ge_x$ intermixed layer; and forming a first transistor device in the NFET region and a second transistor device in the PFET region.

In another aspect thereof the embodiments of this invention provide a structure that comprises a substrate comprised of Si; a layer of dielectric material disposed on a surface of the substrate and a first transistor device disposed over the layer of dielectric material and a second transistor device disposed over the layer of dielectric material. In the structure the first transistor device is an NFET device having a tensily strained channel comprised of a first layer of intermixed $Si_{1-x}Ge_x$, and the second transistor device is a PFET device having a compressively strained channel comprised of a second layer of intermixed $Si_{1-x}Ge_x$. In the structure a value of x in the first layer of intermixed $Si_{1-x}Ge_x$ is less than a value of x in the second layer of intermixed $Si_{1-x}Ge_x$.

In yet another aspect thereof the embodiments of this invention provide a structure that comprises NFET tensile strained CMOS transistors and PFET compressive strained CMOS transistors that are disposed on a common substrate. The structure is fabricated by a process that comprises providing a Si substrate having an overlying layer of $Si_{1-x}Ge_x$; growing, over the layer of $Si_{1-x}Ge_x$, a layer of Si in what will be an NFET region and a second layer of $Si_{1-x}Ge_x$ in what will be a PFET region; partitioning the layer of $Si_{1-x}Ge_x$ into a structure comprised of a first $Si_{1-x}Ge_x$ sub-layer disposed in the NFET region and into a second $Si_{1-x}Ge_x$ sub-layer disposed in the PFET region; annealing the structure to convert the first $Si_{1-x}Ge_x$ sub-layer and the overlying Si layer into a tensily strained $Si_{1-x}Ge_x$ intermixed layer and to convert the second $Si_{1-x}Ge_x$ sub-layer and the overlying second layer of $Si_{1-x}Ge_x$ into a compressively strained $Si_{1-x}Ge_x$ intermixed layer, where a value of x in the tensily strained $Si_{1-x}Ge_x$ intermixed layer is less than a value of x in the compressively strained $Si_{1-x}Ge_x$ intermixed layer; and forming a first transistor device in the NFET region and a second transistor device in the PFET region.

BRIEF DESCRIPTION OF THE SEVERAL VIEWS OF THE DRAWINGS

FIG. 1 shows a starting structure (starting wafer) comprised of a Si substrate, an overlying BOX and a layer of strain relaxed $Si_{1-x}Ge_x$;

FIG. 2 shows a result of performing patterned epitaxial growth processes that are used to grow, over the layer of strain relaxed $Si_{1-x}Ge_x$, a layer of Si on what will be an NFET region and a layer of $Si_{1-x}Ge_x$ on what will be a PFET region, and that further shows the formation of a trench that partitions the layer of strain relaxed $Si_{1-x}Ge_x$ into a first $Si_{1-x}Ge_x$ sub-layer disposed in the NFET region and into a second $Si_{1-x}Ge_x$ sub-layer disposed in the PFET region;

FIG. 3 shows a result of deposition of a capping layer and a performance of an anneal process that converts the first $Si_{1-x}Ge_x$ sub-layer and the overlying Si layer into a first $Si_{1-x}Ge_x$ intermixed layer and that simultaneously converts the second $Si_{1-x}Ge_x$ sub-layer and the overlying layer of $Si_{1-x}Ge_x$ into a second $Si_{1-x}Ge_x$ intermixed layer;

FIG. 4 shows the structure of FIG. 3 after photolithographically defining fins and etching the first $Si_{1-x}Ge_x$ intermixed layer and the second $Si_{1-x}Ge_x$ intermixed layer to form an NFET fin and a PFET fin; and FIG. 5 illustrates an alternate embodiment where planar CMOS transistors are formed in the first $Si_{1-x}Ge_x$ intermixed layer and in the second $Si_{1-x}Ge_x$ intermixed layer instead of the FinFET CMOS transistors shown in FIG. 4.

DETAILED DESCRIPTION

Figure 1:
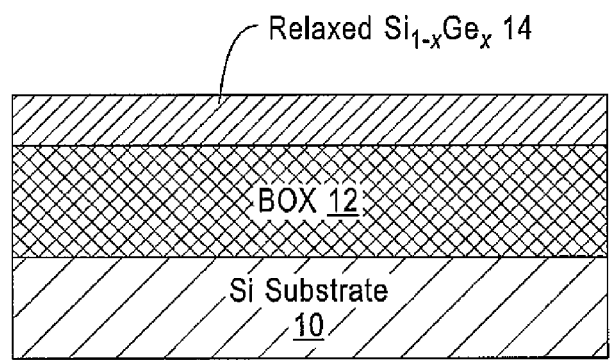
FIGS. 1-5 are each an enlarged cross-sectional view showing various initial, intermediate and completed or substantially completed structures that are fabricated in accordance with embodiments of this invention, wherein the various layer thicknesses and other dimensions are not necessarily drawn to scale. More specifically.

The word "exemplary" is used herein to mean "serving as an example, instance, or illustration." Any embodiment described herein as "exemplary" is not necessarily to be construed as preferred or advantageous over other embodiments. All of the embodiments described in this Detailed Description are exemplary embodiments provided to enable persons skilled in the art to make or use the invention and not to limit the scope of the invention which is defined by the claims.

The terms "epitaxial growth and/or deposition" and "epitaxially formed and/or grown" mean the growth of a semiconductor material on a deposition surface of a semiconductor material, in which the semiconductor material being grown has the same crystalline characteristics as the semiconductor material of the deposition surface. In an epitaxial deposition process, the chemical reactants provided by source gases are controlled and the system parameters are set so that the depositing atoms arrive at the deposition surface of the semiconductor substrate with sufficient energy to move around on the surface and orient themselves to the crystal arrangement of the atoms of the deposition surface. Therefore, an epitaxial semiconductor material has the same crystalline characteristics as the deposition surface on which it is formed. For example, an epitaxial semiconductor material deposited on a {100} crystal surface will take on a {100} orientation. In some embodiments, epitaxial growth and/or deposition processes are selective to forming on semiconductor surface, and do not deposit material on dielectric surfaces, such as silicon dioxide or silicon nitride surfaces.

Examples of various epitaxial growth process apparatuses and methods that are suitable for use in implementing the embodiments of this invention can include, but are not limited to, chemical vapor deposition (CVD) such as, for example, rapid thermal chemical vapor deposition (RTCVD), atmospheric pressure chemical vapor deposition (APCVD), low pressure chemical vapor deposition (LPCVD) and ultra-high vacuum chemical vapor deposition (UHVCVD). Other suitable epitaxial growth processes can include, but are not limited to, molecular beam epitaxy (MBE) and low-energy plasma deposition (LEPD). The temperature for an epitaxial deposition process typically ranges from about 300° C. to about 900° C. Although higher temperature will typically result in faster deposition of the semiconductor material, the faster deposition may also result in crystal defects and film cracking.

In at least one embodiment thereof this invention can employ semiconductor on insulator (SOI) technology where a thin semiconductor layer, such as a layer of SiGe, is formed over an insulating layer, such as silicon oxide, which in turn is formed over a (bulk) substrate, such as a Si substrate. The insulating (dielectric) layer can be referred to as a buried oxide (BOX) layer or simply as a BOX. For a single BOX SOI wafer the SOI layer can be divided into active regions by shallow trench isolation (STI) which intersects the BOX and provides total isolation for active device regions formed in the SOI layer. For FinFET devices fin structures can be defined in the SOI layer and sources and drains can be formed, for example, by ion implantation of N-type or P-type dopants into the fins. A FET channel region between a source/drain pair can be created so as to underlie a gate structure.

It is pointed out that while certain aspects and embodiments of this invention can be employed with SOI substrates, such as a SiGe on insulator substrate, in some further embodiments a bulk (e.g., SiGe) substrate might be used.

The embodiments of this invention pertain to a CMOS integrated circuit with SiGe channels for both NFETs and PFETs, wherein the NFETs are tensily strained and the PFETs are compressively strained.

FIG. 1 shows a starting structure (starting wafer) that can be comprised of a Si substrate 10 of arbitrary thickness, an overlying layer of BOX 12 having an exemplary thickness in a range of about 10 nm-400 nm, and a layer 14 of strain relaxed $Si_{1-x}Ge_x$ (e.g., where x can have a value in a range of about 0.15 to about 0.40). The layer 14 of $Si_{1-x}Ge_x$ could have an exemplary thickness in a range of about 1 nm to about 20 nm, with about 4 nm being one suitable nominal value. The layer 14 of $Si_{1-x}Ge_x$ can be formed using, for example, Ge intermix or Ge thermal condensation processes with initial layers of Si and Ge (e.g., carried out at an exemplary temperature of about 1200° C.). The layer 14 of $Si_{1-x}Ge_x$ can also be formed using, for example, a wafer bonding process where the layer 14 of $Si_{1-x}Ge_x$ is disposed on a handle wafer and thermally bonded to the BOX 12, followed by removal of the handle wafer and thinning, if needed, of the layer 14 of $Si_{1-x}Ge_x$ to the desired thickness.

Figure 2:
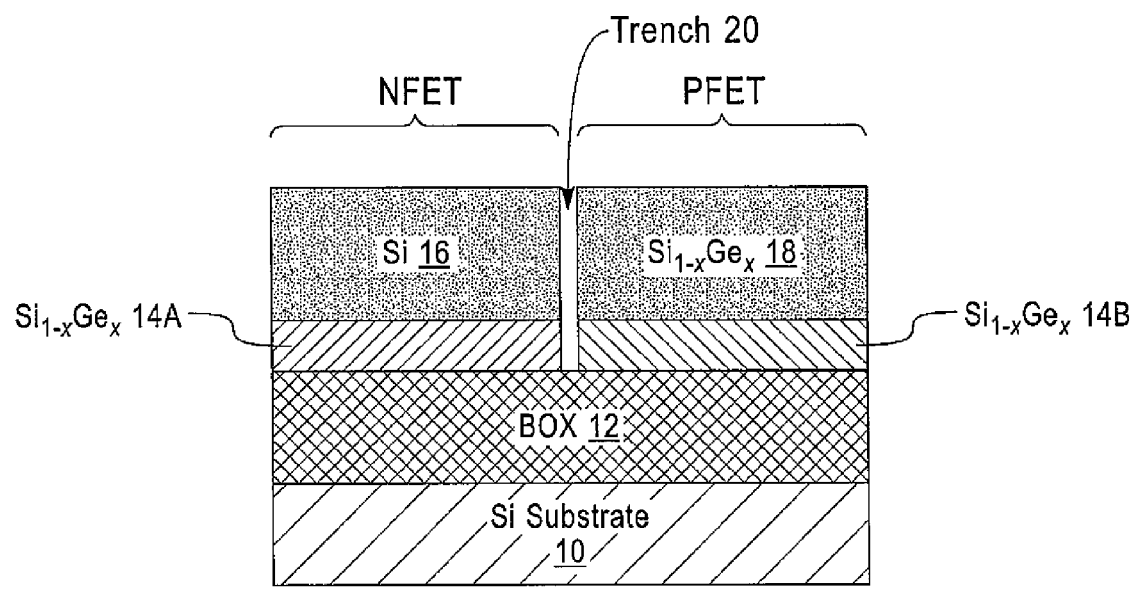

FIG. 2 shows a result of performing patterned epitaxial growth processes that are used to grow a layer 16 of Si on what will be an NFET region and to grow a layer 18 of $Si_{1-x}Ge_x$ (e.g., x=0.50) on what will be a PFET region. This can be accomplished by applying a mask to the surface of the layer 14 of $Si_{1-x}Ge_x$ in the PFET region and epitaxially growing the Si layer 16 upon the surface of the layer 14 of $Si_{1-x}Ge_x$ in the NFET region. The Si layer 16 can have an exemplary thickness in a range of about 10 nm to about 60 nm, with about 40 nm-50 nm being suitable nominal values. The thickness is preferably less that the critical thickness so as to minimize a presence of dislocation defects. This can be followed by applying a mask to a top surface of the Si layer 16 and then epitaxially growing the layer 18 of $Si_{1-x}Ge_x$ upon the surface of the layer 14 of $Si_{1-x}Ge_x$ in the PFET region. It should be noted that the layer 18 of $Si_{1-x}Ge_x$ could be grown prior to growing the layer of 16 of Si. In the layer 18 the value of x is greater than the value of x in the layer 14 of $Si_{1-x}Ge_x$. For example, if the value of x in the layer 14 of $Si_{1-x}Ge_x$ is in the range of about 0.15 to about 0.40 then the value of x in the layer 18 of $Si_{1-x}Ge_x$ can be in a range of about 0.40 to about 0.70. The thickness of the layer 18 is preferably equal to or substantially equal to the thickness of the layer 16.

A trench 20 is formed to physically and electrically isolate the NFET region from PFET region. The trench 20 preferably extends downwards at least to the top surface of the BOX 12. The trench 20 can be formed by partially masking the layers 16 and 18 and then etching the exposed semiconductor material. The trench 20 can be considered to partition the layer 14 of $Si_{1-x}Ge_x$ into a first $Si_{1-x}Ge_x$ sub-layer 14A that is disposed in the NFET region and into a second $Si_{1-x}Ge_x$ sub-layer 14B that is disposed in the PFET region.

Figure 3:
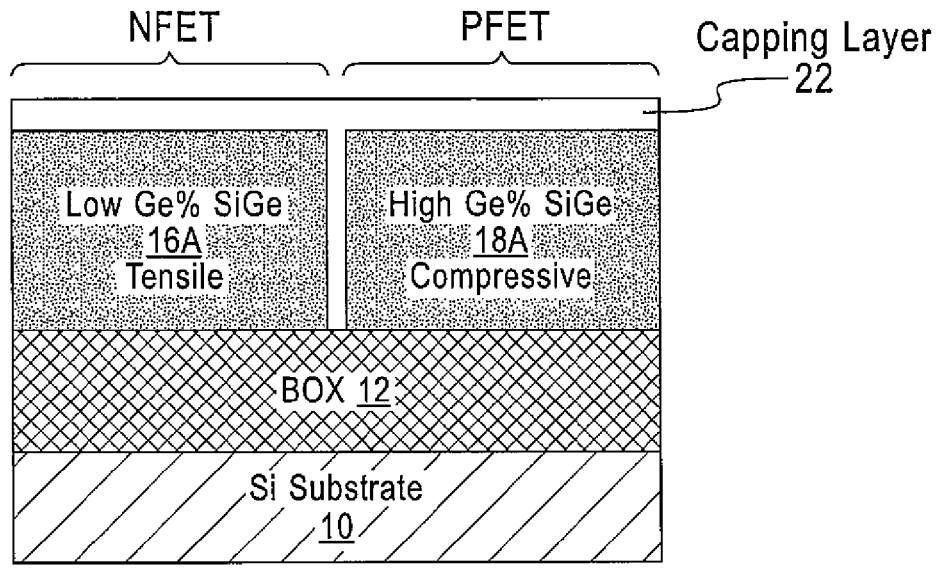

FIG. 3 shows a result of deposition of a capping layer 22, e.g., one composed of an oxide or a nitride, that fills the trench 20, as well as the performance of a thermal anneal process (e.g., one conducted at an exemplary temperature of about 1000° C.) to mix the Si and the Ge. The anneal converts the first $Si_{1-x}Ge_x$ sub-layer 14A and the overlying Si layer 16 into a first $Si_{1-x}Ge_x$ intermixed layer 16A and simultaneously converts the second $Si_{1-x}Ge_x$ sub-layer 14B and the overlying layer 18 of $Si_{1-x}Ge_x$ into a second $Si_{1-x}Ge_x$ intermixed layer 18A. In the NFET region the final Ge percentage of the first $Si_{1-x}Ge_x$ intermixed layer 16A is less than the original Ge percentage of the relaxed layer 14 of $Si_{1-x}Ge_x$ due to the dilution resulting from the presence of the Si layer 16. For example, and assuming the various layer thicknesses and Ge concentrations noted above, the Ge concentration in the first $Si_{1-x}Ge_x$ intermixed layer 16A could be about 0.05%. Due to the resulting difference in the lattice between the first $Si_{1-x}Ge_x$ intermixed layer 16A and the Si substrate 10 the first $Si_{1-x}Ge_x$ intermixed layer 16A is tensile strained. In the PFET region the final Ge percentage of the second $Si_{1-x}Ge_x$ intermixed layer 18A is greater than the original Ge percentage of the relaxed layer 14 of $Si_{1-x}Ge_x$ due to the Ge enhancement resulting from the presence of the SiGe layer 18 that has the greater Ge percentage than the underlying second $Si_{1-x}Ge_x$ sub-layer 14B. Due to the resulting difference in the lattice between the second $Si_{1-x}Ge_x$ intermixed layer 18A and the Si substrate 10 the second $Si_{1-x}Ge_x$ intermixed layer 18A is compressively strained.

Figure 4:
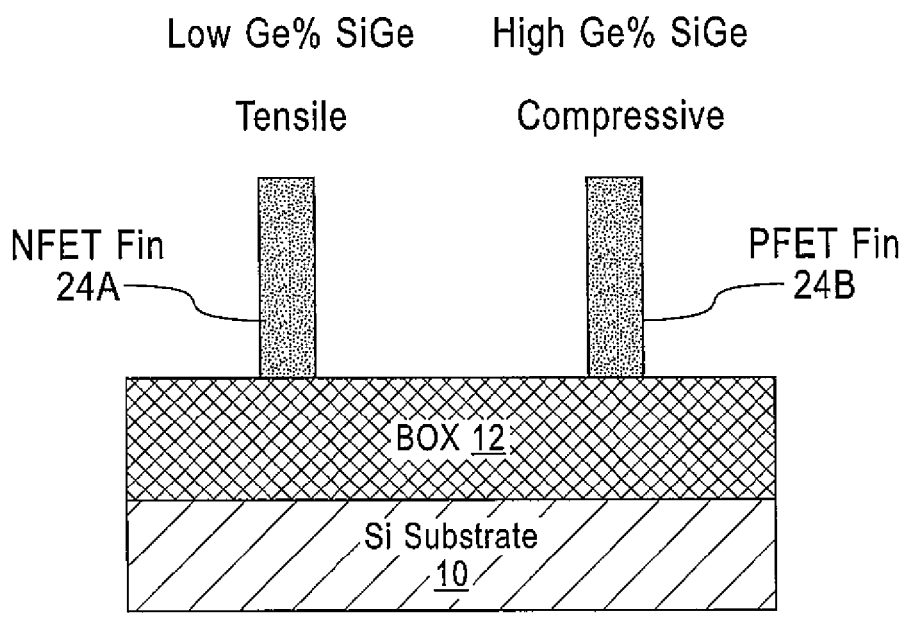

FIG. 4 shows the structure of FIG. 3 after photolithographically defining fins and etching the first $Si_{1-x}Ge_x$ intermixed layer 16A and the second $Si_{1-x}Ge_x$ intermixed layer 18A to form an NFET fin 24A and a PFET fin 24B. The capping layer 22 can first be removed and fin patterning masks applied or it can be patterned and selectively removed to leave portions where fins 24A and 24B are desired. The NFET fin 24A is tensile strained and the PFET fin 24B is compressively strained. The height of the fins 24A, 24B is comparable to the sum of the thicknesses of the layer 14 of $Si_{1-x}Ge_x$ (e.g., about 4 nm) and the thicknesses of the Si layer 16 and the $Si_{1-x}Ge_x$ layer 18 (e.g., 40 nm). If desired, and by example, the thicknesses of the first $Si_{1-x}Ge_x$ intermixed layer 16A and the second $Si_{1-x}Ge_x$ intermixed layer 18A can be adjusted prior to fin patterning to obtain a desired fin height for the fins 24A and 24B. The fins 24A and 24B can have a width governed by the width of the fin patterning mask, e.g., about 7 nm to about 14 nm (or greater). The fin length can have any desired value depending on the end use. Processing of the fins 24A and 24B can then continue in a conventional manner to form source/drains (S/Ds), gate structures, dielectric layer deposition(s) and vertical and horizontal metallization as needed for the final circuitry.

Figure 5:
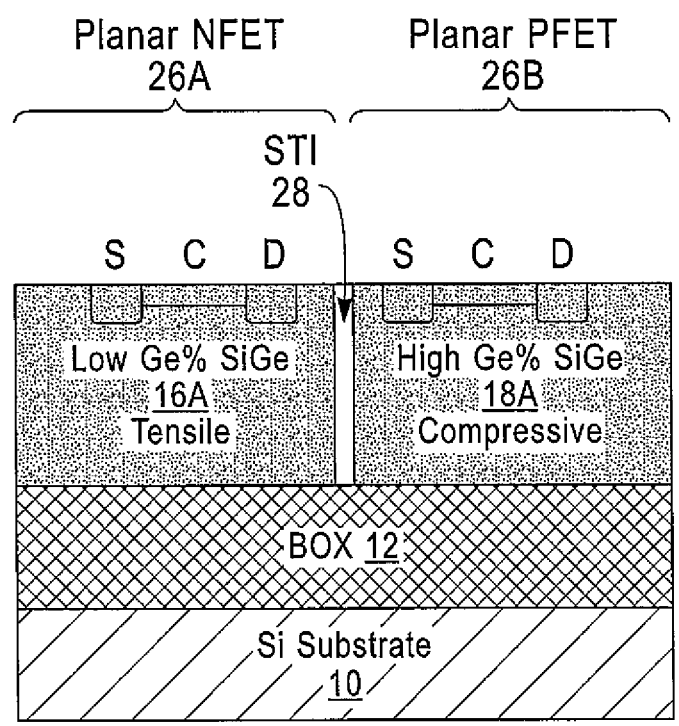

FIG. 5 illustrates an alternate embodiment where planar CMOS transistors are formed instead of the FinFET CMOS transistors shown in FIG. 4. In this embodiment the first $Si_{1-x}Ge_x$ intermixed layer 16A and the second $Si_{1-x}Ge_x$ intermixed layer 18A are processed to fabricate a planar NFET 26A and a planar PFET 26B by forming source (S), channel (C) and drain (D) regions adjacent to the top surfaces. For example, the surfaces can be implanted with suitable S/D dopants followed by other conventional processes to form S/D contacts, gate stack structures and contacts, dielectric layer deposition(s) and vertical and horizontal metallization as needed for the final circuitry. In some embodiments the S/Ds could be raised S/Ds. A STI 28 can be formed (if the capping layer material that fills the trench 20 is not retained) to electrically isolate the planar NFET device 26A from the planar PFET device 26B. In this embodiment the channel of the planar NFET 26A is tensily strained and the channel of the planar PFET 26B is compressively strained. It can be noted that in some embodiments both the FinFET device structures of FIG. 4 and the planar device structures of FIG. 5 can be formed on the same Si substrate 10.

In view of the foregoing description of the exemplary embodiments of this invention it can be realized that a semiconductor structure can be formed over a substrate to comprise an NFET and a PFET, where both the NFET and the PFET have SiGe channels, where the NFET has a lower Ge % than the PFET, where the NFET SiGe is tensily strained and where the PFET SiGe is compressively strained.

It is noted that any one of the structures shown in FIGS. 1-5 could be viewed as an intermediate structure formed during the overall process of providing the semiconductor structure.

It is to be understood that although the exemplary embodiments discussed above with reference to FIGS. 1-5 can be used on common variants of the FET device including, e.g., FET devices with multi-fingered FIN and/or gate structures and FET devices of varying gate width and length. Moreover, transistor devices can be connected to metalized pads or other devices by conventional ultra-large-scale integration (ULSI) metalization and lithographic techniques.

Integrated circuit dies can be fabricated with various devices such as a field-effect transistors, bipolar transistors, metal-oxide-semiconductor transistors, diodes, resistors, capacitors, inductors, etc. An integrated circuit in accordance with the present invention can be employed in applications, hardware, and/or electronic systems. Suitable hardware and systems in which such integrated circuits can be incorporated include, but are not limited to, personal computers, communication networks, electronic commerce systems, portable communications devices (e.g., cell phones), solid-state media storage devices, functional circuitry, etc. Systems and hardware incorporating such integrated circuits are considered part of this invention. Given the teachings of the invention provided herein, one of ordinary skill in the art will be able to contemplate other implementations and applications of the techniques of the invention.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated. As such, various modifications and adaptations may become apparent to those skilled in the relevant arts in view of the foregoing description, when read in conjunction with the accompanying drawings and the appended claims. As but some examples, the use of other similar or equivalent semiconductor fabrication processes, including deposition processes and etching processes may be used by those skilled in the art. Further, the exemplary embodiments are not intended to be limited to only those materials, insulators, Ge concentrations, layer thicknesses and the like that were specifically disclosed above. Any and all such and similar modifications of the teachings of this invention will still fall within the scope of this invention.

What is claimed is:

1. A method, comprising:
   providing a Si substrate having an overlying first layer of $Si_{1-x}Ge_x$;
   growing, over the first layer of $Si_{1-x}Ge_x$, a layer of Si in what will be an NFET region and a second layer of $Si_{1-x}Ge_x$ in what will be a PFET region, where the second layer of $Si_{1-x}Ge_x$ is grown directly upon a top surface of the first layer of $Si_{1-x}Ge_x$;
   partitioning the first layer of $Si_{1-x}Ge_x$ into a structure comprised of a first $Si_{1-x}Ge_x$ sub-layer disposed in the NFET region and into a second $Si_{1-x}Ge_x$ sub-layer disposed in the PFET region;

annealing the structure to convert the first $Si_{1-x}Ge_x$ sub-layer and the overlying Si layer into a tensily strained $Si_{1-x}Ge_x$ intermixed layer and to convert the second $Si_{1-x}Ge_x$ sub-layer and the overlying second layer of $Si_{1-x}Ge_x$ into a compressively strained $Si_{1-x}Ge_x$ intermixed layer, where a value of x in the tensily strained $Si_{1-x}Ge_x$ intermixed layer, due to dilution of the first $Si_{1-x}Ge_x$ sub-layer by the overlying Si layer, is less than a value of x in the compressively strained $Si_{1-x}Ge_x$ intermixed layer; and forming a first transistor device in the NFET region and a second transistor device in the PFET region.

2. The method as in claim 1, where the first layer of $Si_{1-x}Ge_x$ is a strain relaxed $Si_{1-x}Ge_x$ layer.

3. The method of claim 1, where providing the Si substrate having the overlying first layer of $Si_{1-x}Ge_x$ provides a dielectric layer disposed between the Si substrate and the first layer of $Si_{1-x}Ge_x$.

4. The method of claim 1, where in the first layer of $Si_{1-x}Ge_x$ x has a value in a range of about 0.15 to about 0.40.

5. The method of claim 1, where the first layer of $Si_{1-x}Ge_x$ has a thickness in a range of about 1 nm to about 20 nm.

6. The method as in claim 1, where the layer of Si and the second layer of $Si_{1-x}Ge_x$ each have a thickness in a range of about 10 nm to about 60 nm.

7. The method as in claim 1, where in the second layer of $Si_{1-x}Ge_x$ x has a value in a range of about 0.40 to about 0.70.

8. The method of claim 1, where in the first layer of $Si_{1-x}Ge_x$ x has a value in a range of about 0.15 to about 0.40, and where in the second layer of $Si_{1-x}Ge_x$ x has a value in a range of about 0.40 to about 0.70.

9. The method as in claim 1, where forming the first transistor device in the NFET region and the second transistor device in the PFET region comprises forming a first fin structure in the tensily strained $Si_{1-x}Ge_x$ intermixed layer and forming a second fin structure in the compressively strained $Si_{1-x}Ge_x$ intermixed layer.

10. The method as in claim 1, where forming the first transistor device in the NFET region and the second transistor device in the PFET region comprises forming a first planar transistor structure in the tensily strained $Si_{1-x}Ge_x$ intermixed layer and forming a second planar transistor structure in the compressively strained $Si_{1-x}Ge_x$ intermixed layer.

11. A structure, comprising:
a substrate comprised of Si;
a layer of dielectric material disposed on a surface of the substrate;
a first layer of $Si_{1-x}Ge_x$ disposed over the layer of dielectric material, the first layer of $Si_{1-x}Ge_x$ having a top surface and being differentiated into a first sub-layer of $Si_{1-x}Ge_x$ and a second sub-layer of $Si_{1-x}Ge_x$;
a layer of Si disposed on the top surface of the first sub-layer of $Si_{1-x}Ge_x$ in what will be a tensily strained channel NFET device region; and
a second layer of $Si_{1-x}Ge_x$ disposed directly on the top surface of the second sub-layer of $Si_{1-x}Ge_x$ in what will be a compressively strained channel PFET device region;
wherein in the first layer of $Si_{1-x}Ge_x$ x has a value in a range of about 0.15 to about 0.40, and wherein in the second layer of $Si_{1-x}Ge_x$ x has a value in a range of about 0.40 to about 0.70.

12. The structure as in claim 11, where the NFET device and the PFET device are both FinFET devices.

13. The structure as in claim 11, where the NFET device and the PFET device are both planar transistor devices.

14. The structure as in claim 11, where the first layer of $Si_{1-x}Ge_x$ is a strain relaxed $Si_{1-x}Ge_x$ layer.

15. A structure comprising NFET tensile strained CMOS transistors and PFET compressive strained CMOS transistors disposed on a common substrate, the structure fabricated by a process that comprises:
providing a Si substrate having an overlying first layer of $Si_{1-x}Ge_x$;
growing, over the first layer of $Si_{1-x}Ge_x$, a layer of Si in what will be an NFET region and a second layer of $Si_{1-x}Ge_x$, in what will be a PFET region, where the second layer of $Si_{1-x}Ge_x$ is grown directly upon a top surface of the first layer of $Si_{1-x}Ge_x$ in the PFET region;
partitioning the first layer of $Si_{1-x}Ge_x$ into a structure comprised of a first $Si_{1-x}Ge_x$ sub-layer disposed in the NFET region and into a second $Si_{1-x}Ge_x$ sub-layer disposed in the PFET region;
annealing the structure to convert the first $Si_{1-x}Ge_x$ sub-layer and the overlying Si layer into a tensily strained $Si_{1-x}Ge_x$ intermixed layer and to convert the second $Si_{1-x}Ge_x$ sub-layer and the overlying second layer of $Si_{1-x}Ge_x$ into a compressively strained $Si_{1-x}Ge_x$ intermixed layer, where a value of x in the tensily strained $Si_{1-x}Ge_x$ intermixed layer is less than a value of x in the compressively strained $Si_{1-x}Ge_x$ intermixed layer; and
forming a first transistor device in the NFET region and a second transistor device in the PFET region; wherein the value of x in the tensily strained $Si_{1-x}Ge_x$ intermixed layer is a result of a value of x in the first $Si_{1-x}Ge_x$ sub-layer as diluted by the Si in the overlying layer of Si.

16. The structure as in claim 15, where the first layer of $Si_{1-x}Ge_x$ is a strain relaxed $Si_{1-x}Ge_x$ layer.

17. The structure as in claim 15, where providing the Si substrate having the overlying first layer of $Si_{1-x}Ge_x$ provides a dielectric layer disposed between the Si substrate and the first layer of $Si_{1-x}Ge_x$.

18. The structure as in claim 15, where in the first layer of $Si_{1-x}Ge_x$ x has a value in a range of about 0.15 to about 0.40, and where the first layer of $Si_{1-x}Ge_x$ has a thickness in a range of about 1 nm to about 20 nm, where the layer of Si and the second layer of $Si_{1-x}Ge_x$ each have a thickness in a range of about 10 nm to about 60 nm, and where in the second layer of $Si_{1-x}Ge_x$ x has a value in a range of about 0.40 to about 0.70.

19. The structure as in claim 15, where forming the first transistor device in the NFET region and the second transistor device in the PFET region comprises forming a first fin structure in the tensily strained $Si_{1-x}Ge_x$ intermixed layer and forming a second fin structure in the compressively strained $Si_{1-x}Ge_x$ intermixed layer.

20. The structure as in claim 15, where forming the first transistor device in the NFET region and the second transistor device in the PFET region comprises forming a first planar transistor structure in the tensily strained $Si_{1-x}Ge_x$ intermixed layer and forming a second planar transistor structure in the compressively strained $Si_{1-x}Ge_x$ intermixed layer.

* * * * *